United States Patent
Zhang et al.

(10) Patent No.: US 6,190,963 B1
(45) Date of Patent: Feb. 20, 2001

(54) COMPOSITE IRIDIUM-METAL-OXYGEN BARRIER STRUCTURE WITH REFRACTORY METAL COMPANION BARRIER AND METHOD FOR SAME

(75) Inventors: Fengyan Zhang, Vancouver; Sheng Teng Hsu, Camas; Jer-shen Maa; Wei-Wei Zhuang, both of Vancouver, all of WA (US)

(73) Assignee: Sharp Laboratories of America, Inc., Camas, WA (US)

( * ) Notice: Under 35 U.S.C. 154(b), the term of this patent shall be extended for 0 days.

(21) Appl. No.: 09/316,661

(22) Filed: May 21, 1999

(51) Int. Cl.[7] .................. H01L 21/8242; H01L 21/20; H01L 21/00

(52) U.S. Cl. .................. 438/254; 438/3; 438/396; 438/653; 438/686; 438/608

(58) Field of Search .................. 438/653, 686, 438/608, 3, 254, 396

(56) References Cited

U.S. PATENT DOCUMENTS

| | | | |
|---|---|---|---|
| 5,008,687 | 4/1991 | Longman et al. | 346/135.1 |
| 5,573,979 | * 11/1996 | Tsu et al. | 437/195 |
| 5,668,040 | * 9/1997 | Byun | 438/396 |
| 5,708,284 | 1/1998 | Onishi | 257/295 |
| 5,793,057 | * 8/1998 | Summerfelt | 257/55 |
| 5,807,774 | * 9/1998 | Desu et al. | 438/240 |
| 5,834,357 | * 11/1998 | Kang | 438/396 |
| 5,854,107 | 12/1998 | Park et al. | 438/254 |
| 5,861,332 | * 1/1999 | Yu et al. | 438/240 |
| 6,048,740 | * 4/2000 | Hsu et al. | 438/3 |
| 6,121,083 | * 9/2000 | Matsuki | 438/254 |

OTHER PUBLICATIONS

Article entitled, "Improvement of Ta Diffusion Barrier Performance in Cu Metallization by Insertion of a Thin Zr Layer Into Ta Film", by J.S. Kwak and H.K. Baik, published in Applied Physics Letters, vol. 72, No. 22, pp. 2832–2834.

Article entitled, "Investigation of Pt/Ta Diffusion Barrier Using Hybrid Conductive Oxide ($RuO_2$) for High Dielectric Applications" by D–S. Yoon and H. K. Baik, published in J. Vac. Sci. Technol. B. 16(3), May/Jun. 1998, pp. 1137–1141.

Article entitled, "Oxidation Resistance of Tantalum–Ruthenium Dioxide Diffusion Barrier for Memory Capacitor Bottom Electrodes" by D–S Y, H.K. Baik, S–M Lee, C–S Park and S–I Lee, published in Applied Physics Letters, vol. 73, No. 3, Jul. 1998, pp. 324–326.

Article entitled, "Oxide ($CeO_2$)–incorporated new diffusion barrier for Cu metallization" by D–S Yoon, S–M Lee and H. K. Baik, published in 1998 Materials Research Society, Conference Proceedings ULSI XIII, pp. 103–109.

* cited by examiner

*Primary Examiner*—Richard Booth
*Assistant Examiner*—Jennifer M. Kennedy
(74) *Attorney, Agent, or Firm*—David C. Ripma; Matthew D. Rabdau; Scott C. Krieger

(57) ABSTRACT

An Ir—M—O composite film has been provided that is useful in forming an electrode of a ferroelectric capacitor, where M includes a variety of refractory metals. The Ir combination film is resistant to high temperature annealing in oxygen environments. When used with an underlying barrier layer made from the same variety of M transition metals, the resulting conductive barrier also suppresses to diffusion of Ir into any underlying Si substrates. As a result, Ir silicide products are not formed, which degrade the electrode interface characteristics. That is, the Ir combination film remains conductive, not peeling or forming hillocks, during high temperature annealing processes, even in oxygen. The Ir—M—O conductive electrode/barrier structures are useful in nonvolatile FeRAM devices, DRAMs, capacitors, pyroelectric infrared sensors, optical displays, optical switches, piezoelectric transducers, and surface acoustic wave devices. A method for forming an Ir—M—O composite film barrier layer and an Ir—M—O composite film ferroelectric electrode are also provided.

24 Claims, 6 Drawing Sheets

(a) Ir-Al-O (c) Ir-Ti-O (c) Ir-Nb-O (d) Ir-Zr-O

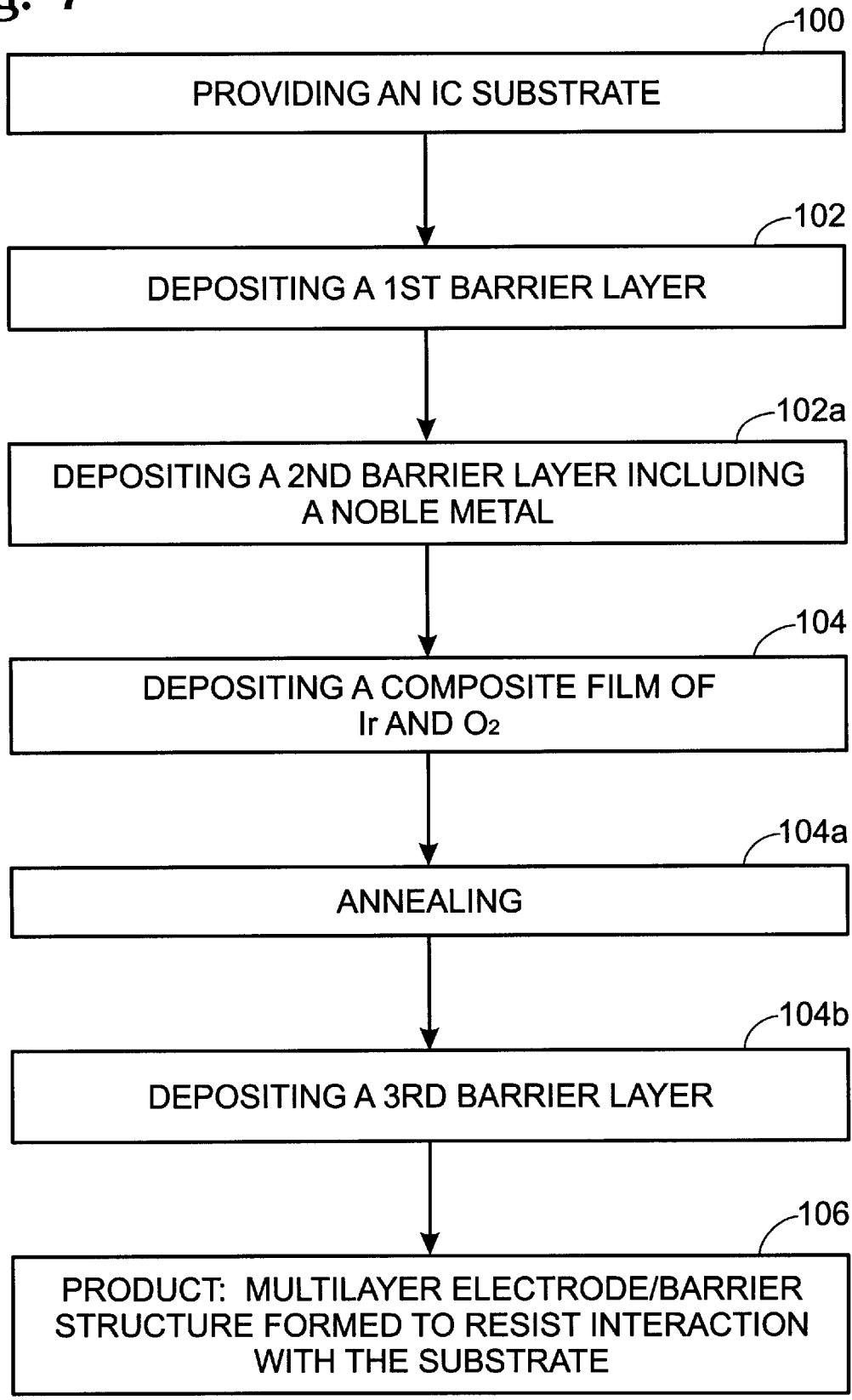

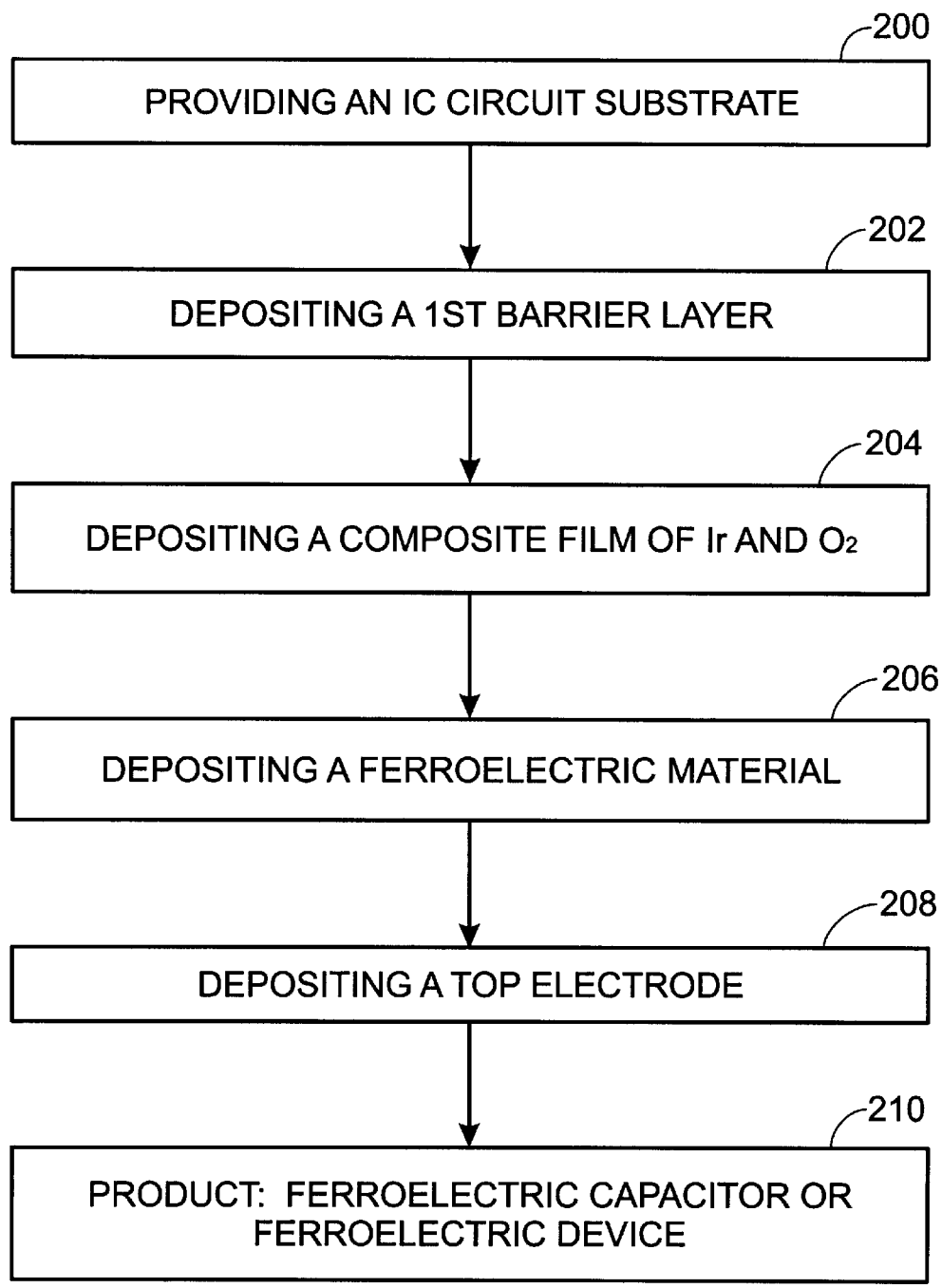

COMPOSITE IRIDIUM-METAL-OXYGEN BARRIER STRUCTURE WITH REFRACTORY METAL COMPANION BARRIER AND METHOD FOR SAME

BACKGROUND AND SUMMARY OF THE INVENTION

The present invention is generally related to the fabrication of integrated circuits (ICs) and, more specifically, to the fabrication of a highly stable conductive electrode barrier using a composite film including iridium, oxygen, and a transition metal, with an adjacent barrier including a transition metal.

Platinum (Pt) and other noble metals are used in IC ferroelectric capacitors. The use of noble metals is motivated by their inherent chemical resistance. This property is especially desirable under high temperature oxygen annealing conditions, such as those seen in the fabrication of ferroelectric capacitors. In addition, chemical interaction between noble metals and ferroelectric materials such as perovskite metal oxides, is negligible.

The above-mentioned noble metals are used as conductive electrode pairs separated by a ferroelectric material. One, or both of the electrodes are often connected to transistor electrodes, or to electrically conductive traces in the IC. As is well known, these ferroelectric devices can be polarized in accordance with the voltage applied to the electrode, with the relationship between charge and voltage expressed in a hysteresis loop. When used in memory devices, the polarized ferroelectric device can be used to represent a "1" or a "0". These memory devices are often called ferro-RAM, or FeRAM. Ferroelectric devices are nonvolatile. That is, the device remains polarized even after power is removed from the IC in which the ferroelectric is imbedded.

There are problems in the use of metal, even noble metal electrodes. Pt, perhaps the widely used noble metal, permits the diffusion of oxygen, especially during high temperature annealing processes. The diffusion of oxygen through Pt results in the oxidation of the neighboring barrier and substrate material. Typically, the neighboring substrate material is silicon or silicon dioxide. Oxidation can result in poor adhesion between the Pt and neighboring layer. Oxidation can also interfere with the conductivity between neighboring substrate layers. Silicon substrates are especially susceptible to problems occurring as a result of oxygen diffusion. The end result may be a ferroelectric device with degraded memory properties. Alternately, the temperature of the IC annealing process must be limited to prevent the degradation of the ferroelectric device.

Various strategies have been attempted to improve the interdiffusion, adhesion, and conductivity problems associated with the use of noble metals as a conductive film in IC fabrication. Titanium (Ti), titanium oxide ($TiO_2$), and titanium nitride (TiN) layers have been interposed between a noble metal and silicon (Si) substrates to suppress the interdiffusion of oxygen. However, Ti layers are generally only effective below annealing temperatures of 600 degrees C. After a 600 degree C. annealing, Pt diffuses through the Ti layer to react with silicon, forming a silicide product. Further, the Pt cannot stop the oxygen diffusion. After a high temperature annealing, a thin layer of silicon oxide may be formed on the silicon surface, which insulates contact between silicon and the electrode.

Other problems associated with the annealing of a Pt metal film are peeling and hillock formation. Both these problems are related to the differences in thermal expansion and stress of Pt with neighboring IC layers during high temperature annealing. A layer of Ti overlying the Pt film is known to reduce stress of the Pt film, suppressing hillock formation.

Ir has also been used in attempts to solve the oxygen interdiffusion problem. Ir is chemically stable, having a high melting temperature. Compared to Pt, Ir is more resistant to oxygen diffusion. Further, even when oxidized, iridium oxide remains conductive. When layered next to Ti, the Ir/Ti barrier is very impervious to oxygen interdiffusion. However, Ir can react with Ti. Like Pt, Ir is very reactive with silicon or silicon dioxide. Therefore, a bilayered Ir/Ti or Ir/TiN barrier is not an ideal barrier metal.

Co-pending application Ser. No. 09/263,595, entitled "Iridium Conductive Electrode/Barrier Structure and Method for Same", invented by Zhang et al., and filed on Mar. 5, 1999, discloses a multilayered Ir/Ta film that is resistant to interdiffusion.

Co-pending application Ser. No. 09/263,970, entitled "Iridium Composite Barrier Structure and Method for Same", invented by Zhang et al., and filed on Mar. 5, 1999, discloses a Ir composite film that is resistant to interdiffusion, and highly stable during high temperature annealing.

Co-pending application Ser. No. 09/316,646, entitled "Composite Iridium Barrier Structure with Oxidized Refractory Metal Companion Barrier and Method for Same", invented by Zhang et al., and filed on May 21, 1999, discloses a Ir composite film with an oxidized transitional metal barrier layer that is resistant to the interdiffusion, and highly stable during high temperature annealing.

It would be advantageous if alternate methods were developed for the use of Ir as a conductor, conductive barrier, or electrode in IC fabrication. It would be advantageous if the Ir could be used without interaction to an underlying Si substrate.

It would be advantageous if an Ir film could be altered with other conductive metals to improve interdiffusion properties and structural stability. Further, it would be advantageous if this improved type of Ir film could be layered with an interposing film to prevent the interaction of Ir with a silicon substrate.

It would be advantageous if the above-mentioned Ir-metal film could resist the interdiffusion of oxygen at high annealing temperatures. It would also be advantageous if the Ir-metal film was not susceptible to peeling problems and hillock formation.

It would be advantageous if the Ir-metal film could be produced which remains electrically conductive after annealing at high temperatures and oxygen ambient conditions.

Accordingly, a highly temperature stable conductive barrier layer for use in an integrated circuit is provided. The barrier comprises an underlying silicon substrate, a first barrier film including a refractory metal barrier overlying the substrate, and an iridium-refractory metaloxygen (Ir—M—O) composite film overlying the first barrier film. Typically, the first barrier film is selected from the group of materials consisting of Ta, Ti, Nb, Zr, Hf, TiN, TaN, NbN, ZrN, AlN, and HfN. The first barrier layer has a thickness in the range of approximately 10 to 100 nanometers (nm). The first barrier prevents the interdiffusion of Ir into the Si or $SiO_2$ substrate. It also prevents other reactions between the first composite film and the substrate.

The Ir—M—O composite film remains conductive after high temperature annealing processes in an oxygen environment. Further, the Ir—M composite film resists hillock formation, and resists peeling. Specifically, the Ir composite film includes the following materials: Ir—Ta—O, Ir—Hf—O, Ir—Ti—O, Ir—Nb—O, Ir—Al—O, and Ir—Zr—O. Typically, the Ir—M—O composite film has a thickness in the range of approximately 10 to 500 nm. The above-mentioned transition metals, as well as oxygen, are added to the first composite film to stuff the Ir polycrystalline grain boundaries to improve its stability, and to resist barrier penetration and hillock formation.

In some aspects of the invention, a second barrier film including a noble metal overlies the first barrier layer, to limit the diffusion of oxygen into the first composite film. The second barrier helps prevent the oxidation of the first barrier during annealing processes. The second barrier film is selected from the group of materials consisting of iridium oxide (IrO2), ruthenium oxide (RuO2), Ir, platinum (Pt), and ruthenium (Ru).

In some aspects of the invention a third barrier film, including a noble metal, overlies the Ir—M—O composite film. The third barrier material is selected from the group of materials including $IrO_2$, $RuO_2$, Ir, Ru, and Pt. The third barrier improves the interface between the first composite film and the subsequently deposited film, such as a ferroelectric film, improving crystal orientation, and improving the leakage current and fatigue characteristics of the subsequently formed ferroelectric device.

In some aspects of the invention, the barrier is used as an electrode in a ferroelectric device. Then, a ferroelectric film overlies the Ir—M—O film. A conductive metal film made of a noble metal, of the above-mentioned Ir—M composite film, or of other multilayered conductive top electrode overlies the ferroelectric film. The ferroelectric film is capable of storing charges between the top and Ir—M—O electrodes.

Also provided is a method for forming a highly temperature stable conductive barrier overlying an integrated circuit substrate. The method comprising the steps of:

a) through PVD (physical vapor deposition), CVD (chemical vapor deposition), or MOCVD (metal organic chemical vapor deposition) processes, depositing a first barrier layer, as described above, overlying the substrate;

b) through PVD, CVD, and MOCVD processes, depositing a first composite film including iridium, a transition metal, and oxygen, as described above, overlying the first barrier layer to a thickness in the range of approximately 10 to 500 nm; and $b_1$) annealing the first composite film in an atmosphere selected from the group of gases consisting of oxygen, $N_2$, Ar, and a vacuum, and in which the annealing temperature is in the range of approximately 400 to 1000 degrees C., whereby the conductivity of the first composite film is improved and the thickness of the first composite film is stabilized.

In some aspects of the invention, a further step follows Step a), of:

$a_1$) through CVD, PVD, or MOCVD processes, depositing a second barrier layer including a noble metal, as described above, overlying the first barrier layer. The second barrier layer resists the diffusion of oxygen into the first barrier film.

In some aspects of the invention, wherein a ferroelectric capacitor is formed, a further step follows Step b), of:

c) (optional) using PVD, CVD, and MOCVD deposition processes, depositing a third barrier layer, of the above-described noble metal materials, over the Ir—M—O composite film to a thickness in the range of approximately 10 to 200 nm, improving the first composite film interface to subsequently deposited materials;

d) depositing a ferroelectric material overlying the first composite film; and e) depositing a conductive top electrode overlying the ferroelectric material, whereby a ferroelectric capacitor is formed.

Sputtering is one PVD process used to deposit the composite and barrier films. For example, the first barrier material can be deposited from a 4 inch diameter targets by sputtering in Step a) at a power in the range of approximately 50 to 800 watts, in an Ar atmosphere at a pressure of 2–100 millitorr (mT). Step b) can include cosputtering Ir and a metal targets with a power level in the range of approximately 50 to 800 watts. The metal targets are selected from the group of metals consisting of Ta, Ti, Nb, Zr, Al, and Hf. The atmosphere is Ar—$O_2$ with a flow ratio in the range of approximately 1:5 to 5:1, and the atmosphere pressure is in the range of approximately 2 to 100 mT. When metal nitride is to be deposited, Step a) includes establishing an Ar—$N_2$ atmosphere.

Alternately, Step b) includes depositing the first composite film through PVD deposition, sputtering with a single, composite source, in an oxygen environment. The single composite source material is selected from the group of materials consisting of Ir, Ta, Ti, Nb, Zr, Al, Hf, and oxides of the above-mentioned materials.

BRIEF DESCRIPTION OF THE DRAWINGS

FIG. 7 is a flowchart illustrating steps in a method for forming a highly temperature stable conductive barrier layer, such as used in a ferroelectric capacitor.

FIG. 8 is a flowchart depicting steps in the formation of a ferroelectric capacitor, using the conductive barrier Ir composite film of the present invention.

DETAILED DESCRIPTION OF THE PREFERRED EMBODIMENT

Figure 1:
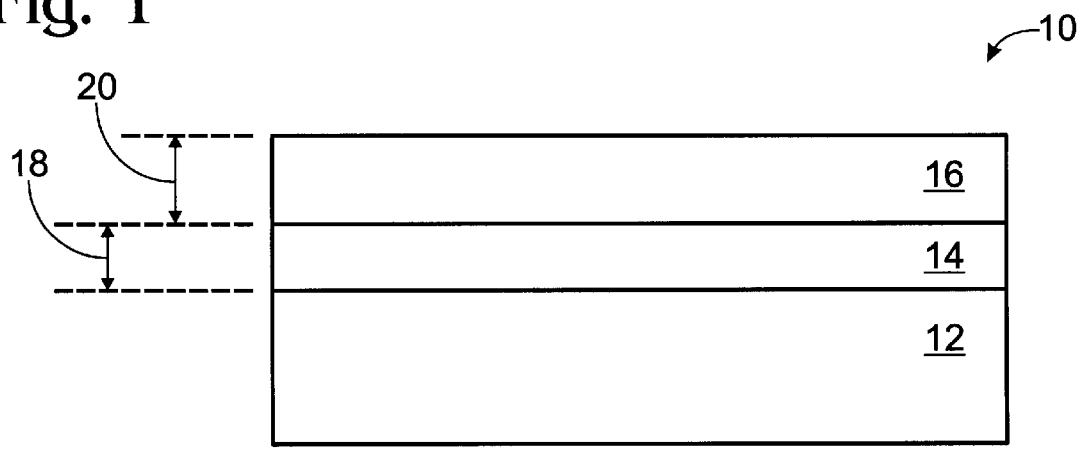
FIGS. 1–4 illustrate steps in a completed, highly temperature stable conductive barrier layer, for use in an integrated circuit.

FIGS. 1–4 illustrate steps in a completed, highly temperature stable conductive barrier layer, for use in an integrated circuit. Specifically, the conductive barrier is useful as an electrode in a ferroelectric capacitor. FIG. 1 depicts conductive barrier 10 comprising a substrate 12, a first barrier film 14, including a metal selected from the group consisting of Ta, Ti, Nb, Zr, Al, and Hf, overlying substrate 12. A first composite film 16 including iridium and oxygen overlies first barrier film 14. First composite film 16 remains conductive after high temperature annealing processes in an oxygen environment.

Substrate 12 is selected from the group of materials consisting of silicon, polysilicon, silicon dioxide, and silicon-germanium compounds, whereby first barrier layer 14 prevents the formation of Ir suicide products. The materials of first barrier film 14 are also selected from the group consisting of the nitrides of transition metals, including TaN, TiN, NbN, ZrN, AlN, and HfN. First barrier layer 14 has a thickness 18 in the range of approximately 10 to 100 nanometers (nm).

Specifically, several types of first composite film 16 are possible. In general, first composite film 16 includes Ir, oxygen, and a transition metal. Conductive barrier layer 10 includes first composite films 16 selected from the group consisting of Ir—Ta—O, Ir—Ti—O, Ir—Nb—O, Ir—Al—O, Ir—Hf—O, and Ir—Zr—O. The conductivity of the electrode layers can be varied by changing the relative composition ratio of metal, Ir, O. When sputtering is used, the composition ratios are varied by adjustment of the power applied to the Ir and metal targets, or by changing the ratio, or partial pressures, of the Ar and $O_2$ gases.

Ir—M—O, first composite film 16 has a thickness 20 in the range of approximately 10 to 500 nm. First composite film 16 and first barrier layer 14 typically include common materials selected from the group consisting of Ta, Ti, Nb, Zr, Al, and Hf. That is, when first composite film 16 includes Ti, first barrier layer 14 includes Ti. Likewise, when first composite film 16 includes Nb, so does first barrier layer 14. When first composite film 16 includes, Zr, so does first barrier layer 14. When first composite film 16 includes Hf, so does first barrier film 14. However, film 16 and barrier 14 need not include common materials. For example, first composite film 16 is Ir—Ta—O, and first barrier is Ti, is some aspects of the invention.

Figure 2:
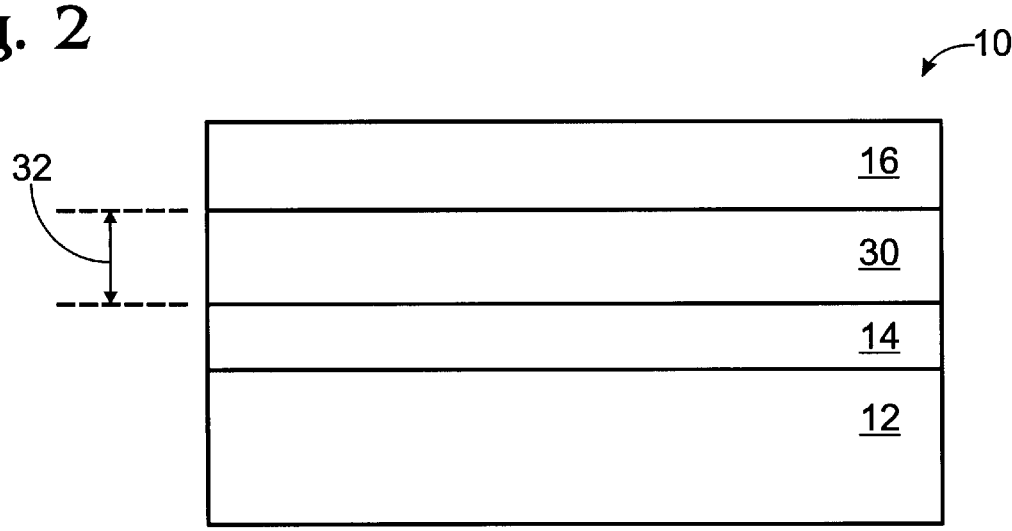

FIG. 2 depicts another aspect of conductive barrier film 10 of FIG. 1. Conductive barrier layer 10 further comprises a second barrier film 30, including a noble metal, overlying first barrier layer 14. Second barrier film 30 limits the diffusion of oxygen into first barrier 14. Second barrier film 30 is selected from the group of materials consisting of iridium oxide ($IrO_2$), ruthenium oxide ($RuO_2$), Ir, platinum (Pt), and ruthenium (Ru). Second barrier film 30 has a thickness 32 in the range of approximately 10 to 200 nm.

Figure 3:
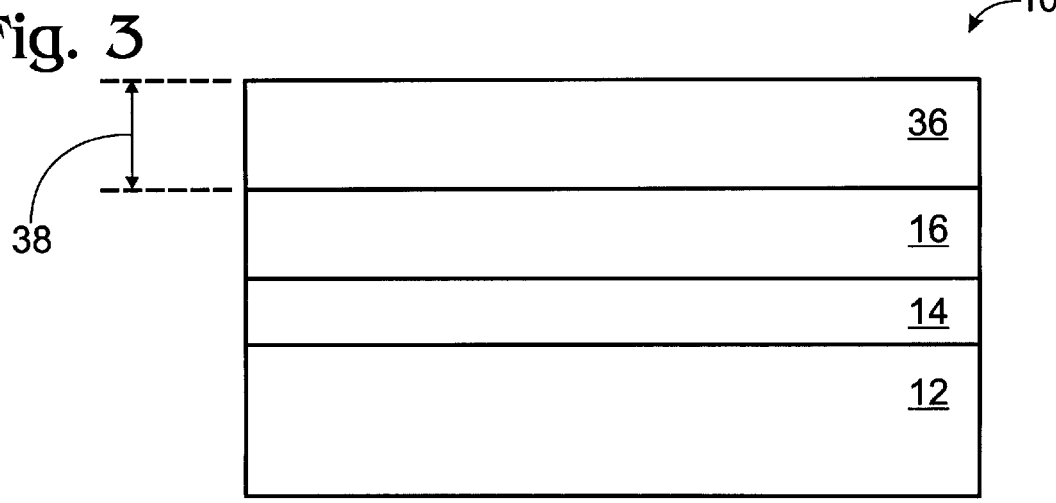

FIG. 3 illustrates another aspect of the present invention barrier layer 10. Alternately, a third barrier layer 36 overlies first composite film 16. The material of third barrier layer 36 is selected from the group consisting of $IrO_2$, $RuO_2$, Ir, Pt, and Ru. Third barrier layer has a thickness 38 in the range of approximately 10 to 200 nm. Third barrier 36 improves the Ir—M—O film 16 interface to subsequently deposited layers.

Figure 4:
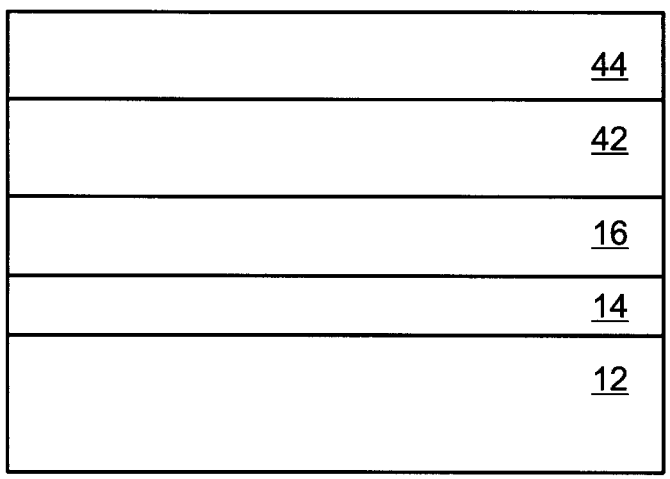

FIG. 4 illustrates conductive barrier layer 10 of FIGS. 1, 2, or 3 included as part of a ferroelectric capacitor 40. Ferroelectric capacitor 40 further includes a ferroelectric film 42 overlying first composite film 16. In some aspects of the invention, third barrier layer 36 (not shown) overlies first composite film 16. In other aspects (not shown), second barrier layer 30 overlies first barrier layer 14. A conductive metal film top electrode 44 overlies ferroelectric film 42. In this manner, ferroelectric film 42 is capable of storing charges, or maintaining polarity, between top electrode 44 and bottom electrode 16. Top electrode 44 is a noble metal, multilayered electrode, and the same material as Ir composite film 16 in alternative aspects of the invention.

The above-mentioned barrier structures can be used as conductive bottom electrode/barrier structures on silicon, polysilicon or silicon dioxide substrate in the nonvolatile memories, such as MFMOS and MFMS type memories, DRAM, capacitors, sensors, displays, and transducer applications.

For example, a barrier structure using Ir—Ta—O/Ta as a conductive bottom electrode/barrier structure for the non-volatile memories application has the extraordinary advantages, as it can sustain 1000° C. annealing without losing its conductivity and integrity. The oxidation of the Ta barrier layer 14 is prevented by inserting a thin Ir layer as second barrier layer 30.

The as-deposited Ir—Ta—O film 16 becomes most conductive with a post deposition annealing at 600–900° C. in $O_2$ ambient for 1–30 min. Thickness of the structure can be stabled by annealing at temperatures of 600° C., or greater, for 1 minute to 2 hours.

FIGS. 5 (a)–(d) illustrate X-ray diffraction spectra of present invention conductive barrier film structures following high temperature annealing in oxygen atmospheres. The first barrier layer is either Ti, Nb, or Zr deposited on a silicon dioxide substrate by sputtering 4 inch targets with 300 W and 5 mT of Ar at room temperature. The electrode layer of Ir-metal-O were obtained by cosputtering Ir and metal 4 inch targets at 300 W on each targets respectively with 10 mT pressure at Ar—$O_2$ ratio of 1:1. The metal here include Ti, Nb, and Zr. For the Ir—Al—O layer, the power used on Al target is 150 W. The base pressure was approximately $1 \times 10^{-7}$ torr. A post deposition annealing in $O_2$ ambient was done from 800° C. to 900° C. to investigate the thermal stability of these structures.

The experiment films of FIGS. 5(a)–(d), show the as-deposited films including very fine Ir polycrystal. After 800° C., $O_2$ annealing for 5 minutes, crystallized $IrO_2$ peaks appeared in all the structures. Specifically, the barrier structures investigated include Ir—Ti—O/Ti/$SiO_2$, Ir—Nb—O/Nb/$SiO_2$, and Ir—Zr—O/Zr/$SiO_2$. The intensity of $IrO_2$ peaks continues to increase after 900° C., $O_2$ annealing. The Ir peaks almost disappear in the Ir—Ti—O, Ir—Nb—O, and Ir—Zr—O films. The strong Ir peaks remain for Ir—Al—O, after 900° C. annealing, due to the smaller target power used on Al target, which results in less Al composition in the Ir—Al—O film. No crystallized $TiO_2$ peaks are observed in the Ir—Ti—O/Ti/$SiO_2$, even after 900° C., $O_2$ annealing. In the Ir—Zr—O/Zr/$SiO_2$ structure, the $ZrO_2$ peaks appear after a one-step 800° C. oxygen annealing. In the Ir—Nb—O/Nb/Si structure, the $Nb_2O_5$ peaks also appear after one-step 800°°C. oxygen annealing, but the intensity of the $Nb_2O_5$ peaks is weak.

Figure 6:
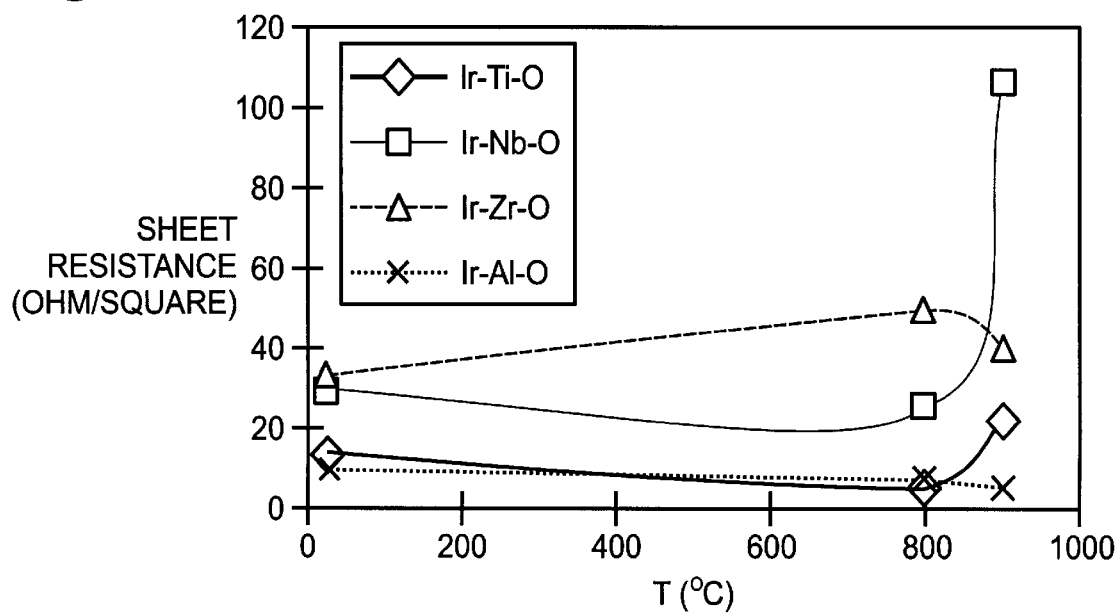
FIG. 6 illustrates sheet resistance changes of some present invention composite films following high temperature annealing in oxygen atmospheres.
Figure 5A:
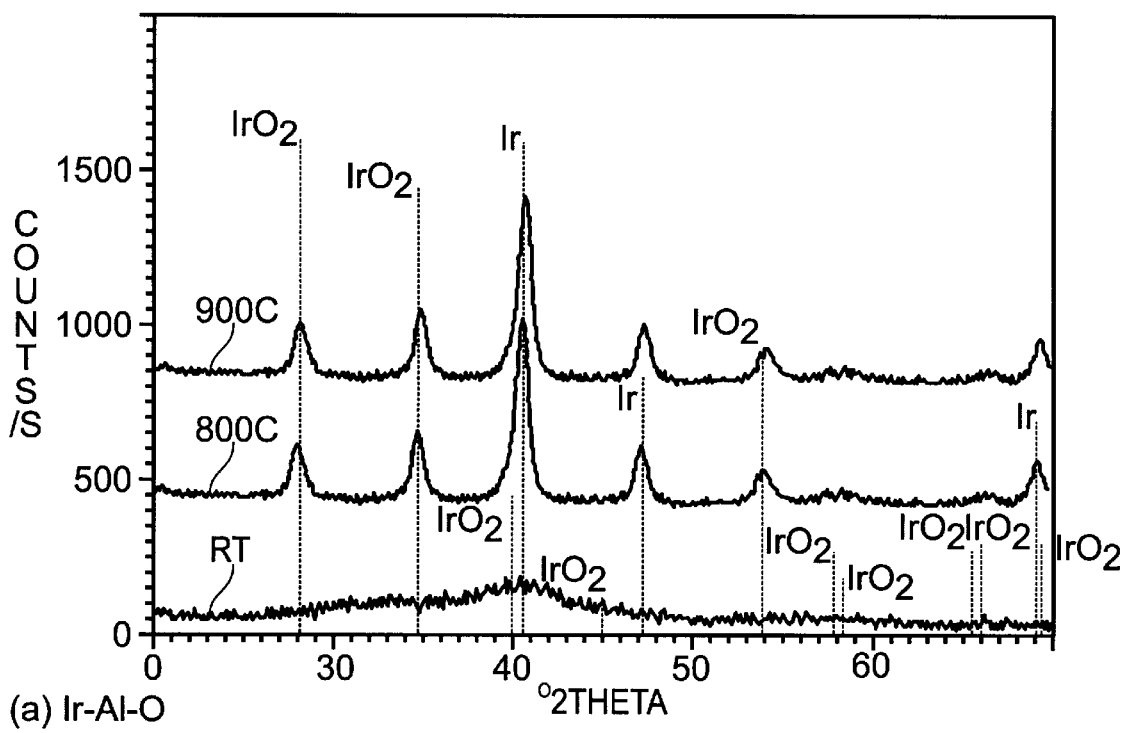
FIGS. 5 (a)–(d) illustrate X-ray diffraction spectra of present invention conductive barrier film structures following high temperature annealing in oxygen atmospheres.
Figure 5B:
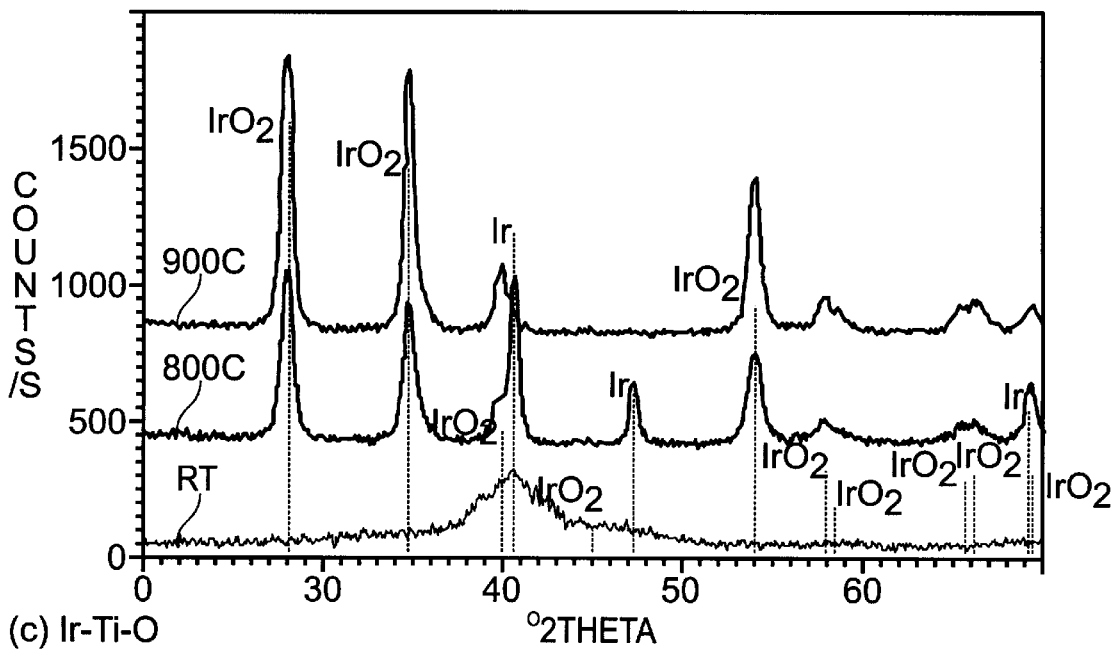
Figure 5C:
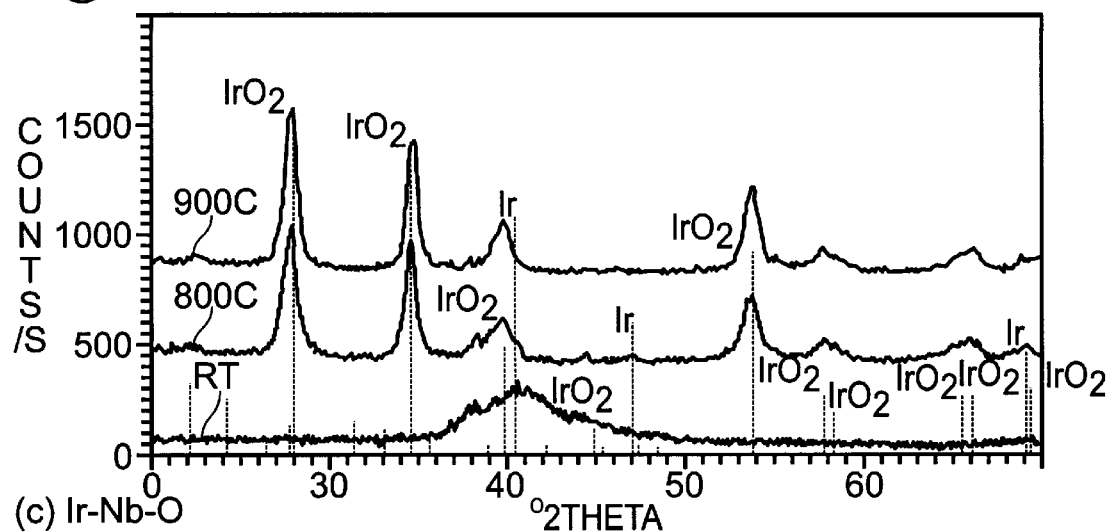
Figure 5D:
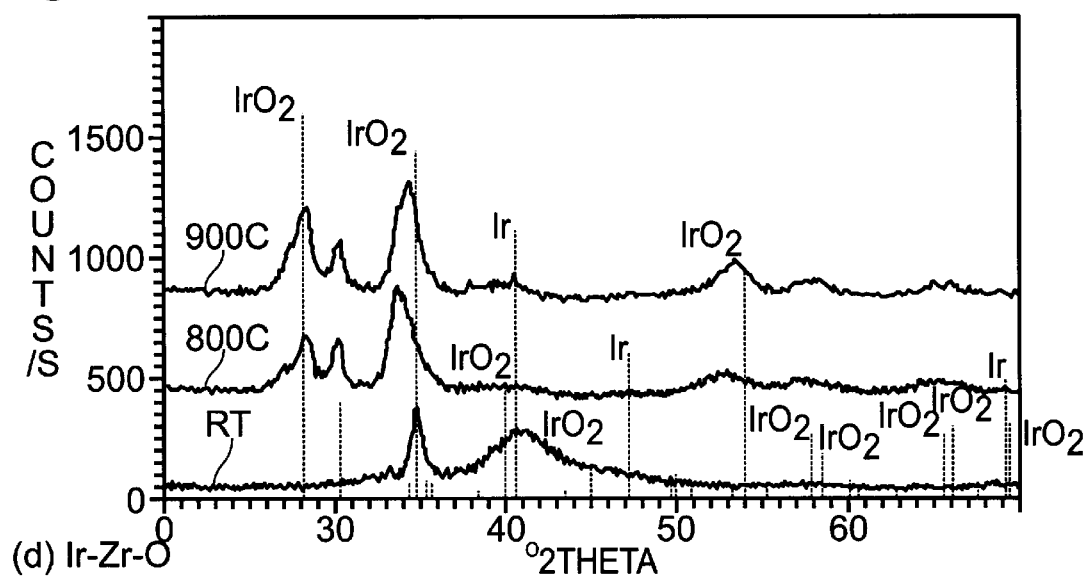

FIG. 6 illustrates sheet resistance changes of some present invention composite films following high temperature annealing in oxygen atmospheres. All the Ir-metal-O films maintain conductive after 900°°C. oxygen annealing for 5 min. The sheet resistance of Ir—Nb—O and Ir—Ti—O films starts to increase after 900°°C. annealing, while the sheet resistance of Ir—Zr—O and Ir—Al—O is lower after 900°°C. annealing, than that of the same films after 800°°C. annealing. No iridium silicide or metal silicide peaks were observed in the XRD spectrum. Thus, good barrier properties are maintained for this Ir-metal-O/metal or metal nitride barrier structure, where the metal includes Ta, Ti, Nb, Al, Hf, and Zr.

The symbol "/", as used herein, defines a layering of films, so that Ir/Ta is a layer of Ir film overlying a Ta film. The symbol "—", as used herein, defines a combination or mixture of elements, so that a Ir—Ta film is a composite film which includes elements of Ir and Ta.

FIG. 7 is a flowchart illustrating steps in a method for forming a highly temperature stable conductive barrier layer, such as used in a ferroelectric capacitor. Step 100 provides an integrated circuit substrate. The substrate is selected from the group of materials consisting of silicon, polysilicon, silicon dioxide, and silicon-germanium compounds. Step 102 forms a first barrier layer including a metal selected from the group consisting of Ta, Ti, Nb, Zr, and Hf, overlying the substrate. Step 102 includes forming a first barrier selected from the group of materials consisting of TaN, TiN, NbN, ZrN, AlN, and HfN. Step 102 includes depositing the first barrier layer through deposition methods selected from the group consisting of CVD, PVD, and MOCVD. It is understood that PVD processes include both dc and RF sputtering deposition methods. In some aspects of the invention, Step 102 includes depositing the first barrier layer at approximately room temperature. Step 102 also includes depositing the first barrier layer to a thickness in the range of approximately 10 to 100 nm.

Step 104 forming a first composite film of iridium and oxygen overlying the first barrier layer. Step 104 includes depositing the first composite film by deposition methods selected from the group consisting of PVD, CVD, and MOCVD. In some aspects of the invention, Step 104 includes depositing the Ir—M—O composite film at approximately room temperature to a thickness in the range of approximately 10 to 500 nm. Step 104 includes the first composite film being selected from the group consisting of Ir—Ta—O, Ir—Ti—O, Ir—Nb—O, Ir—Al—O, Ir—Hf—O, and Ir—Zr—O. Step 106 is a product, where a multilayer structure is formed that is resistive to interaction with the substrate.

In some aspects of the invention, Step 102 includes depositing the first barrier material metal (Ta, Ti, Nb, Zr, and Hf) by sputtering at approximately 50–800 watts in an atmosphere including Ar at a pressure in the range of approximately 2 to 100 mT. Metal nitride first barrier material is formed by sputtering the above-mentioned refractory metals, or Al, in an atmosphere of Ar and $N_2$. With larger targets, the power level is in the range of approximately 2 to 20 kilowatts.

When sputtering is used, Step 100 typically includes establishing a base, pre-deposition, system pressure is below $1 \times 10^{-5}$ and, preferably, $1 \times 10^{-7}$ T. In some aspects of the invention, Step 104 includes depositing the first composite film through PVD deposition. Specifically, dc cosputtering is used with separate Ir and metal targets. The sputtering is conducted in an atmosphere of Ar—$O_2$ in a flow ratio, or partial pressure, in the range of approximately 1:5 to 5:1. The deposition pressure varies from approximately 2 to 100 mT. Further, Step 104 includes cosputtering both targets at a power in the range of approximately 50 to 800 watts, with respect to 4 inch targets. For larger targets, such as 11 inch targets, the power level is scaled up accordingly. A suitable power range for larger targets is approximately 2 to 20 kilowatts (kW). Alternately, the power is expresses as a current density in the range of approximately 10 to 100 milliamps (mA) at approximately a few hundred volts. The metal targets are selected from the group consisting of Ta, Ti, Nb, Zr, Al, and Hf. When metal oxide targets are used, including metal from the above-mentioned group, RF sputtering is typically used instead of dc sputtering.

Alternately, Step 104 includes depositing the first composite film through PVD deposition using sputtering with a single, composite, target in an oxygen environment. Specifically, the single composite source uses a target of Ir and another source material selected from the group consisting of Ta, Ti, Nb, Zr, Al, Hf, and oxides of the above-mentioned metal materials. Typically, the sputtering is conducted in an oxygen atmosphere, although an oxygen atmosphere is less important if the target material contains oxygen in the form of metal oxides.

In some aspects of the invention, a further step follows Step 104. Step 104a includes annealing the first composite film to improve the conductivity and to stabilize the first composite film thickness. Rapid thermal annealing (RTA) and furnace annealing processes are used. The annealing is conducted in an atmosphere selected from the group consisting of $N_2$, $O_2$, Ar, and a vacuum, at an annealing temperature in the range between approximately 400 and 1000 degrees C., for a duration of time in the range of approximately 1 to 120 minutes.

Some aspects of the invention include a further step, following Step 102. Step 102a forms a second barrier layer including a noble metal overlying the first barrier layer, whereby the second barrier layer resists the diffusion of oxygen into the first composite film. Step 102a includes depositing a second barrier film selected from the group consisting of Ir, Ru, IrO2, Pt, and RuO2. Step 102a includes depositing the second barrier layer to a thickness in the range of approximately 10 to 200 nm. The second barrier layer through deposition methods selected from the group consisting of PVD, CVD, and MOCVD. In some aspects of the invention, Step 102a includes depositing the second barrier layer at approximately room temperature.

Some aspects of the invention include a further step, following Step 104. Step 104b forms a third barrier layer selected from the group consisting of Ir, Ru, IrO2, Pt, and RuO2, overlying the first composite film, whereby the third barrier improves the first composite film interface to subsequently deposited materials. As a result, the subsequently deposited film, often a ferroelectric film, forms a device having improved leakage current and fatigue properties, as well as having a film with an improved crystalline structure. Step 104b includes depositing the third barrier film to a thickness in the range of approximately 10 to 200 nm. The third barrier layer deposition methods are selected from the group consisting of PVD, CVD, and MOCVD. In some aspects of the invention, Step 104b includes depositing the third barrier layer at approximately room temperature.

FIG. 8 is a flowchart depicting steps in the formation of a ferroelectric capacitor, using the conductive barrier first composite film of the present invention. Steps 200 through 204 replicate Steps 100 through 104 of FIG. 7. In some aspects of the invention (not shown), a further step forms a second barrier layer over the first barrier. In some aspects of the invention (not shown), a further step forms a third barrier layer over the first composite film. Step 206 forms a ferroelectric material overlying the first composite layer. Step 208 forms a conductive top electrode, as described above, overlying the ferroelectric material. Step 210 is a product, where a ferroelectric capacitor is formed.

An Ir—M—O composite film has been provided that is useful in forming an electrode of a ferroelectric capacitor. The composite film includes a variety of transition metals with oxygen, as well as iridium. The Ir—M—O composite film is structurally very stable and resistant to high temperature annealing in oxygen environments. When used with an underlying transition metal barrier layer, the resulting conductive barrier also suppresses to diffusion of Ir into any underlying Si substrates. As a result, Ir silicide products are not formed which degrade the electrode interface characteristics. The Ir composite film remains conductive, and resists peeling and hillock formation during high temperature annealing processes, even in an oxygen atmosphere. The above-mentioned Ir composite film is useful in the fabrication of nonvolatile memories, such as metal ferroelectric metal oxide silicon (MFMOS), metal ferroelectric metal silicon (MFMS), DRAM, capacitors, pyroelectric infrared sensors, optical displays, optical switches, piezoelectric transducers, and surface acoustic wave (SAW) devices.

Additionally, the Ir composite film is useful in other high temperature oxidation environments. For example, in aerospace applications such a material used in the fabrication of rocket thrusters. Other variations and embodiments will occur to those skilled in the art.

What is claimed is:

1. A method for forming a highly temperature stable conductive barrier overlying an integrated circuit substrate, the method comprising the steps of:

forming a first barrier layer which serves to prevent the interdiffusion of Ir into the integrated circuit substrate, said first barrier layer being selected from the group consisting of Ta, Ti, Nb, Al, Hf, Zr, TaN, TiN, NbN, ZrN, AlN, and HfN overlying the substrate;

forming a second barrier layer overlying said first barrier layer, said second barrier layer inhibiting the oxidation of said first barrier layer during subsequent annealing processes, said step of forming a second barrier layer including depositing a layer of material selected from the group consisting of Ir, Ru, IrO2, Pt, and RuO2; and forming a first composite film including iridium, a refractory metal, and oxygen overlying the second barrier layer, whereby a multilayer structure is formed that is resistive to interaction with the substrate.

2. A method as in claim 1 in which said step of forming a second barrier layer includes depositing the second barrier layer through deposition methods selected from the group consisting of CVD, PVD, and MOCVD.

3. A method as in claim 1 in which said step of forming a second barrier layer includes depositing the second barrier layer at approximately room temperature.

4. A method as in claim 1 in which said step of forming a second barrier layer includes depositing the second barrier layer having a thickness in the range of approximately 10–200 nanometers (nm).

5. A method as in claim 1 including the further steps, following said step of forming a first composite film, of:

forming a third barrier layer selected from the group of materials consisting of $IrO_2$, $RuO_2$, Ir, Ru, and Pt overlying the first composite film, whereby the interface between the first composite film and a subsequently deposited material is improved.

6. A method as in claim 5 in which said step of forming a third barrier layer includes depositing the third barrier layer to a thickness in the range of approximately 10 to 200 nm using PVD, CVD, and MOCVD deposition methods.

7. A method as in claim 5 in which said step of forming a third barrier layer includes depositing the third barrier layer at approximately room temperature.

8. A method as in claim 1 in which said step of forming a first composite film includes depositing the first composite film to a thickness in the range of approximately 10 to 500 nm.

9. A method as in claim 1 in which said step of forming a first composite film includes depositing the first composite film by deposition methods selected from the group consisting of PVD, CVD, and MOCVD.

10. A method as in claim 9 in which said step of forming a first composite film includes dc cosputtering separate Ir and a metal targets with a power level in the range of approximately 2 to 20 kilowatts, in which the metal targets are selected from the group of metals consisting of Ta, Ti, Nb, Zr, Al, and Hf, in which the atmosphere is Ar—$O_2$ in a ratio in the range of approximately 1:5 to 5:1, and in which the atmosphere pressure is in the range of approximately 2 to 100 mT.

11. A method as in claim 9 in which said step of forming a first composite film includes RF cosputtering separate Ir and a metal oxide targets with a power level in the range of approximately 2 to 20 kilowatts, in which the metal oxide targets including metal selected from the group of metals consisting of Ta, Ti, Nb, Zr, Al, and Hf, in which the atmosphere is Ar—$O_2$ in a ratio in the range of approximately 1:5 to 5:1, and in which the atmosphere pressure is in the range of approximately 2 to 100 mT.

12. A method as in claim 9 in which said step of forming a first composite film includes depositing the first composite film through PVD deposition, sputtering with a single, composite source, in an oxygen environment.

13. A method as in claim 12 in which said step of forming a first composite film includes the single composite source being a target of Ir and a source material selected from the group of materials consisting of Ir, Ta, Ti, Nb, Zr, Al, Hf, and oxides of the above-mentioned materials.

14. A method as in claim 1 in which said step of forming a first composite film includes the first composite film being selected from the group of materials consisting of Ir—Ta—O, Ir—Ti—O, Ir—Nb—O, Ir—Al—O, Ir—Hf—O, and Ir—Zr—O.

15. A method as in claim 1 in which said step of forming a first composite film includes depositing the first composite film at approximately room temperature.

16. A method as in claim 1 in which said step of forming a first barrier layer includes depositing the first barrier layer through deposition methods selected from the group consisting of PVD, CVD, and MOCVD.

17. A method as in claim 16 in which said step of forming a first barrier layer includes depositing the first barrier material by sputtering at a power in the range of approximately 2 to 20 kilowatts, in an Ar atmosphere at a pressure of approximately 2 to 100 millitorr (mT).

18. A method as in claim 1 in which said step of forming a first barrier layer includes sputtering a metal selected from the group consisting of Ta, Ti, Nb, Al, Hf, and Zr in an Ar—$N_2$ ambient atmosphere.

19. A method as in claim 1 in which said step of forming a first barrier layer includes depositing the first barrier layer at approximately room temperature.

20. A method as in claim 1 in which said step of forming a first barrier layer includes depositing the first barrier layer to a thickness in the range of approximately 10 to 100 nm.

21. A method as in claim 1, wherein a ferroelectric capacitor is formed, including further steps, following said step of forming a first composite film, of:

forming a ferroelectric material overlying the first composite film; and forming a conductive top electrode overlying the ferroelectric material, whereby a ferroelectric capacitor is formed.

22. A method as in claim 1 including a further step, following said step of forming a first composite film, of:

annealing the first composite film, whereby the conductivity of the first composite film is improved and the thickness of the first composite film is stabilized.

23. A method as in claim 22 in which said step of annealing the first composite film includes annealing in an atmosphere selected from the group of gases consisting of oxygen, $N_2$, Ar, and a vacuum, and in which the annealing temperature is in the range of approximately 400 to 1000 degrees C., for a time duration in the range of approximately 1 to 120 minutes.

24. A method as in claim 1 wherein the substrate is selected from the group of materials consisting of silicon, polysilicon, silicon dioxide, and silicon-germanium compounds.

* * * * *